(12) United States Patent
Shih et al.

(10) Patent No.: US 7,259,995 B2
(45) Date of Patent: Aug. 21, 2007

(54) MEMORY DEVICE

(75) Inventors: Yen-Hao Shih, Hsinchu (TW);
Hang-Ting Lue, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 161 days.

(21) Appl. No.: 11/016,666

(22) Filed: Dec. 17, 2004

(65) Prior Publication Data

US 2006/0133153 A1 Jun. 22, 2006

(51) Int. Cl.
*G11C 16/04* (2006.01)

(52) U.S. Cl. .................. 365/185.28; 365/185.24; 365/185.18

(58) Field of Classification Search .......... 365/185.28, 365/185.29, 185.24, 185.18; 257/313–317, 257/214, E29.129, E29.3, E21.179, E21.68
See application file for complete search history.

(56) References Cited

U.S. PATENT DOCUMENTS 6,246,606 B1 * 6/2001 Forbes et al. .......... 365/185.03
6,545,314 B2    4/2003 Forbes et al.
6,667,212 B1   12/2003 Shiraiwa et al.
6,670,241 B1   12/2003 Kamal et al.
6,803,299 B2 * 10/2004 Eitan ..................... 438/593
6,847,556 B2 *  1/2005 Cho ..................... 365/185.28

OTHER PUBLICATIONS

Lusky et al., "Electrons Retention Model for Localized Charge in Oxide-Nitride-Oxide (ONO) Dielectric", IEEE Electron Device Letters, vol. 23, No. 9, pp. 556-558 (Sep. 2002).
Yang et al., "Charge Retention of Scaled SONOS Nonvolatile Memory Devices at Elevated Temperatures", Solid State Electronics 44 (2000) pp. 949-958.

* cited by examiner

*Primary Examiner*—David Lam
(74) *Attorney, Agent, or Firm*—Knobbe, Martens, Olson & Bear LLP

(57) ABSTRACT

A method of stabilizing a memory device comprises trapping a plurality of electric charges in a charge trapping layer of the memory device. The charge trapping layer is positioned between a transistor control gate and a transistor channel region. The method further comprises applying a negative voltage bias to the transistor control gate. In another embodiment, the method further comprises performing a baking process on the memory device. The method further comprises performing a memory operation on the memory device.

33 Claims, 5 Drawing Sheets

MEMORY DEVICE

FIELD OF THE INVENTION

The present invention relates generally to methods for fabricating a memory device, and more specifically to methods for stabilizing electrons trapped in a charge trapping memory device.

BACKGROUND OF THE INVENTION

Various memory devices have been developed for use as electronic memory media for computers and similar systems. Such memories include electrically erasable programmable read only memory ("EEPROM") and electrically programmable read only memory ("EPROM"), each of which has advantages and disadvantages. In particular, EEPROM can be easily erased without extra exterior equipment, but has reduced data storage density, lower speed, and higher cost. In contrast, EPROM is less expensive and has greater data storage density, but cannot be easily erased.

A newer type of memory, called Flash EEPROM, or flash memory, has become popular because it combines the high density and low cost advantages of EPROM with the electrical erasability advantages of EEPROM. Flash memory can be rewritten and can retain its contents without consuming power. Flash memory is used in many portable electronic products, such as mobile telephones, portable computers, voice recorders, as well as in many larger electronic systems, such as automobiles, airplanes, and industrial control systems.

An exemplary conventional flash memory device is a charge trapping flash memory device. A charge trapping flash memory device comprises a field effect transistor ("FET") having a charge trapping layer that is positioned between a control gate and a transistor channel region. The charge trapping layer is electrically isolated by a gate insulator, which is also interposed between the control gate and the channel region. In a conventional configuration, the charge trapping layer and the gate insulator form a oxide-nitride-oxide ("ONO") stack. The charge trapping layer includes point trapping sites capable of receiving and holding an electron. Generally, the trapping sites have varying trapping energies, or "depths". The trapping energy is defined as the quantity of energy required to free an electron from a trapping site.

A charge trapping flash memory device can be programmed by the channel hot electron ("CHE") technique, in which hot electron injection is induced from the channel region, surmounting the gate insulator, to the trapping sites in a charge trapping layer, thereby leading to a nonvolatile negative charge in the charge trapping layer. Electrons trapped in the trapping sites cause a measurable change in the drain current of the transistor. Thus, "charge trapping" in the charge trapping layer forms the basis for the operation of such charge trapping memory devices.

SUMMARY OF THE INVENTION

As explained above, the trapping sites in a charge trapping layer generally have varying trapping energies, or "depths". Disadvantageously, electrons in shallow traps can be freed in a high temperature environment, under a high electric field, or in other operations on the memory cell. For example, during an erase operation, negative voltages as high as −10 volts can be applied to memory cells along a particular word line (though higher or lower voltages can be used), even if only one memory cell on the word line is to be erased. Therefore, all the memory cells sharing this particular word line suffer a −10 volt stress. Electrons in shallow traps can be inadvertently freed during such high electric field operations.

Over time, release of electrons from the shallow traps causes the transistor threshold voltage ($V_{th}$) to decrease, thus resulting in memory volatility and data loss. Therefore, techniques have been developed to remove unstable electrons from shallow traps, and/or to move unstable electrons to deeper traps, thereby stabilizing $V_{th}$ during the memory retention period and enhancing data retention.

According to one embodiment of the present invention, a method of stabilizing a memory device comprises trapping a plurality of electric charges in a charge trapping layer of the memory device. The charge trapping layer is positioned between a transistor control gate and a transistor channel region. The method further comprises applying a negative voltage bias to the transistor control gate. The method further comprises performing a memory operation on the memory device.

According to another embodiment of the present invention, a method of stabilizing a memory device comprises trapping a plurality of electric charges in a change trapping layer of the memory device. The charge trapping layer is positioned between a transistor control gate and a transistor channel region. The method further comprises subjecting the memory device to a high-temperature baking process. The method further comprises performing a memory operation on the memory device.

According to another embodiment of the present invention, a method comprises trapping a plurality of electric charges in a charge trapping layer of a transistor. The charge trapping layer is separated from a transistor control gate and a transistor channel region by a gate insulator. The method further comprises performing a charge stabilization operation on the electric charges trapped in the charge trapping layer.

According to another embodiment of the present invention, an apparatus comprises a transistor device having a control gate and a channel region. The apparatus further comprises a gate insulator separating the control gate from the channel region. The apparatus further comprises a plurality of electric charges trapped in a charge trapping layer of the gate insulator. The plurality of charges have an average trapping energy such that a transistor threshold voltage $V_{th}$ of the transistor device decreases by between approximately 0.01 volts and approximately 0.40 volts over a 1000-second period. In another embodiment, the plurality of charges have an average trapping energy such that a transistor threshold voltage $V_{th}$ of the transistor device decreases by between approximately 0.01 volts and approximately 0.20 volts over a 1000-second period. In another embodiment, the plurality of charges have an average trapping energy such that a transistor threshold voltage $V_{th}$ of the transistor device decreases by between approximately 0.02 volts and approximately 0.10 volts over a 1000-second period. In another embodiment, the plurality of charges have an average trapping energy such that a transistor threshold voltage $V_{th}$ of the transistor device decreases by between approximately 0.03 volts and approximately 0.08 volts over a 1000-second period.

BRIEF DESCRIPTION OF THE DRAWINGS

Exemplary embodiments of the charge trapping memory devices, and processes and methods related thereto, disclosed herein are illustrated in the accompanying drawings, which are for illustrative purposes only. The drawings comprise the following figures, in which like numerals indicate like parts.

DETAILED DESCRIPTION OF PREFERRED EMBODIMENTS

Figure 1:
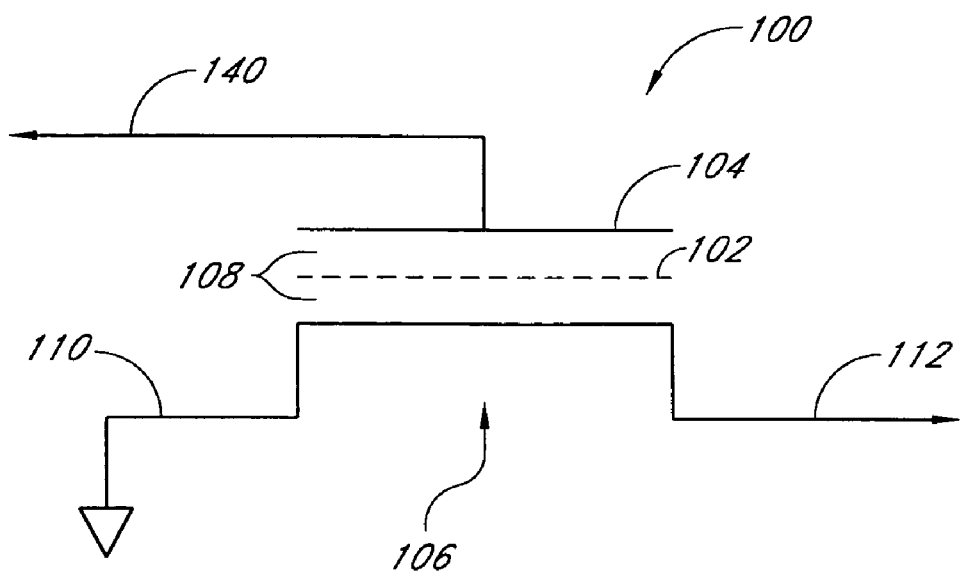
FIG. 1 is a schematic diagram of an exemplary charge trapping flash memory cell.
Figure 2:
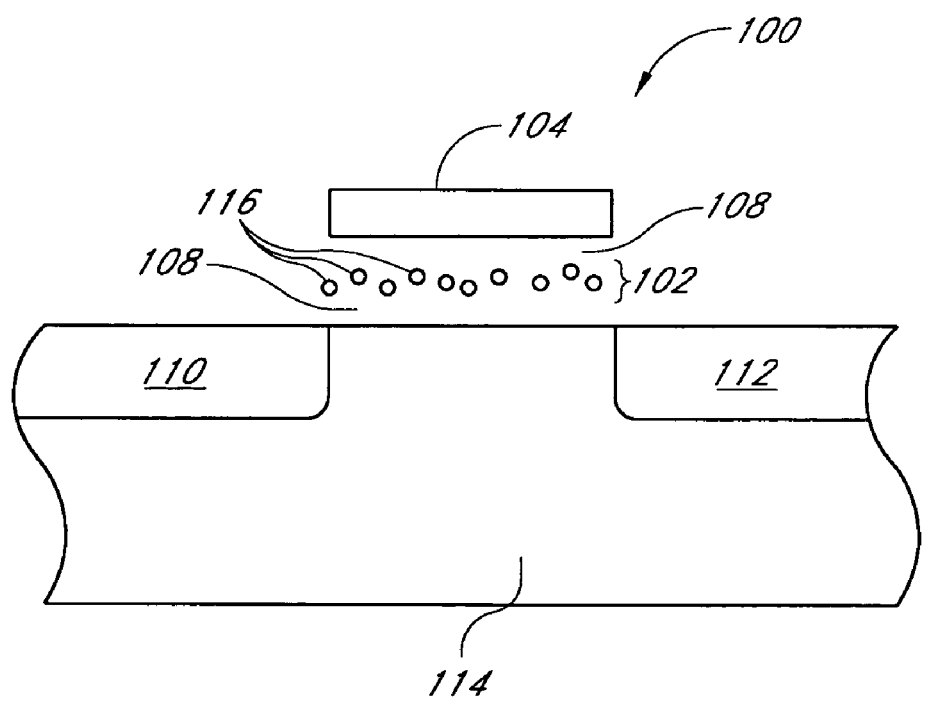
FIG. 2 is a cross-sectional diagram of an exemplary charge trapping flash memory cell.

As described above, techniques have been developed to enhance memory stability and data retention in a flash memory device. A schematic diagram of an exemplary charge trapping flash memory device is illustrated in FIG. 1. The flash memory device includes a FET 100 having a source 110, a drain 112, and a channel region 106. The FET 100 further includes a charge trapping layer 102 that is positioned between a control gate 104 and a transistor channel region 106. The charge trapping layer 102 is electrically isolated by a gate insulator 108, which is also interposed between the control gate 104 and the channel region 106. For example, the charge trapping layer and the gate insulator can be configured to form an ONO stack. The control gate 104 is connected to word line 140, through which the memory device can be addressed. A cross-sectional diagram of a flash memory device supported by a substrate 114 is illustrated in FIG. 2, which further illustrates a plurality of point defect trap sites 116 located in the charge trapping layer 102.

When the CHE technique is used to distribute electrons into trap sites 116 in the charge trapping layer 102, the resulting trapped electrons usually have a wide range of trapping energies. Electrons with a relatively small trapping energy tend to be unstable, and can be released in a high temperature environment, under a high electric field, or in other operations on the memory device. By way of example, a shallow trap site is generally considered to be a trap site that contains electrons at an energy level less than or equal to approximately 1.5 eV. Conversely, a deep trap site is generally considered to be a trap site that contains electrons at an energy level greater than approximately 1.5 eV.

When electrons are freed from shallow trap sites, they initially remain within the gate insulator 108 because the charge trapping layer 102 is isolated from the substrate 114 and the control gate 104 by the gate insulator 108. However, if the gate insulator 108 is leaky due to process issues or cycling, electrons released from shallow trap sites may pass from the charge trapping layer 102 to the substrate 114 or the control gate 104. Release of unstable electrons from shallow trap sites into the substrate 114 or the control gate 104 causes the transistor threshold voltage $V_{th}$ to decrease, thereby resulting in increased memory volatility.

The number of unstable electrons that are released from shallow trap sites in the charge trapping layer 102 can be reduced by removing unstable electrons from the shallow trap sites after the memory cell is programmed. Disclosed herein are techniques for removing unstable electrons from relatively shallow trap sites in the charge trapping layer 102, or for repositioning the removed electrons into deeper traps. In one embodiment, using these techniques can increase data retention by an order of magnitude or more by reducing the extent to which $V_{th}$ decreases during the memory retention period.

Figure 3:
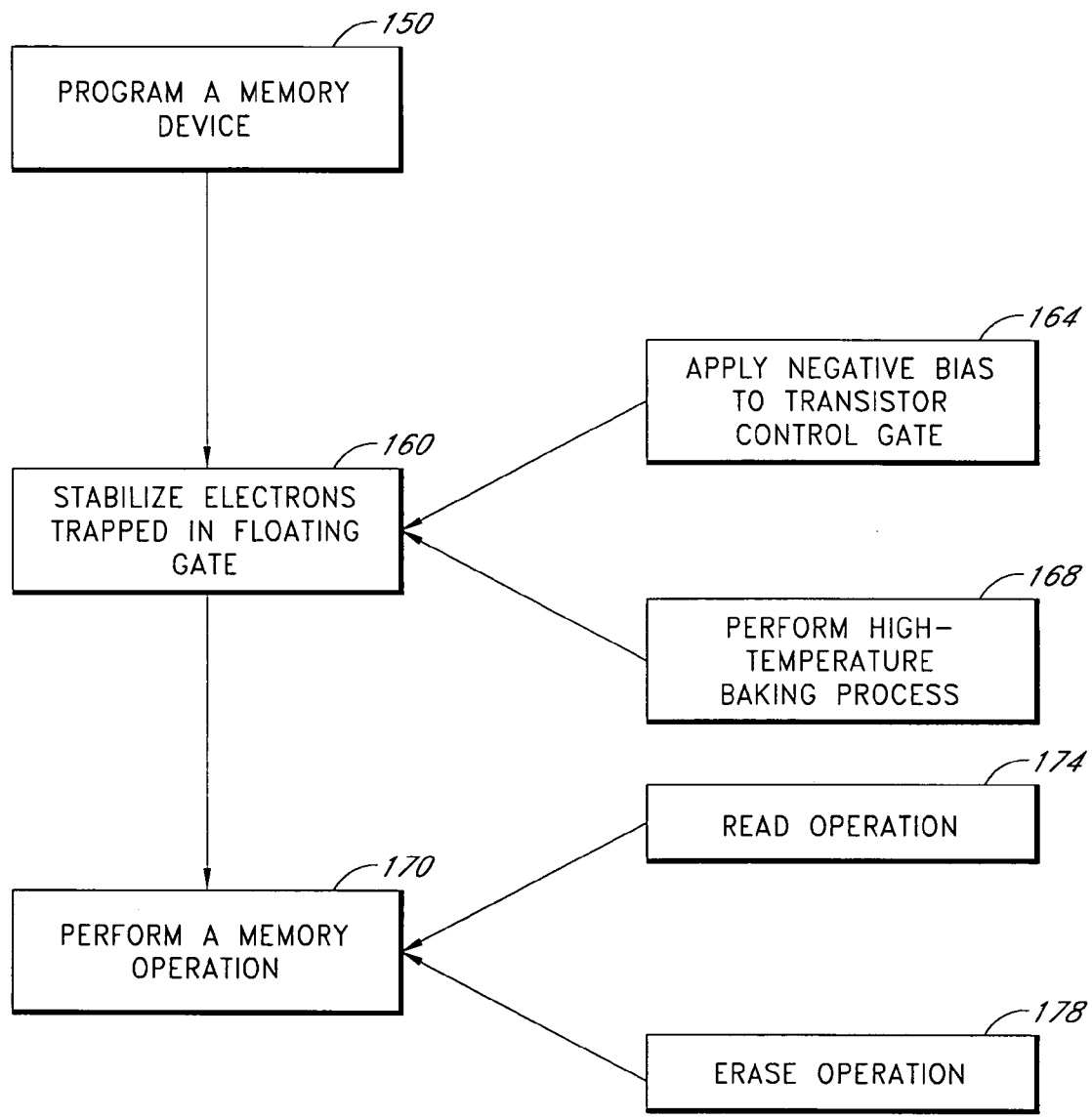
FIG. 3 is a flowchart illustrating exemplary methods for improving data retention in an exemplary charge trapping flash memory cell.

Exemplary methods for improving memory stability in a charge trapping memory device are illustrated in FIG. 3. As illustrated, a memory device is programmed in an operational block 150, such as by distributing electrons into trap sites 116 via the CHE technique. Stabilization of the electrons in the trap sites 116 is performed in an operational block 160 by removing unstable electrons from relatively shallow trap sites. Exemplary techniques for accomplishing this stabilization operation 160 include application of a negative bias to the transistor control gate 104 (illustrated in operational block 164), and performance of a high-temperature baking process (illustrated in operational block 168). These stabilization processes will be discussed in greater detail below.

A memory operation can then be performed on the stabilized memory device in an operational block 170. Exemplary memory operations include read operations (illustrated in operational block 174) and erase operations (illustrated in operational block 178). Because of the stabilization operation 160, an extended amount of data retention time can hold in the memory read operation 170. For example, in one embodiment the stabilization operations disclosed herein can extend data retention time in a charge trapping memory device by at least 10 times as compared to an un-stabilized device, and in another embodiment, the stabilization operations disclosed herein can extend data retention time in a charge trapping memory device by at least 100 times as compared to an un-stabilized device.

As illustrated in FIG. 3, in an exemplary embodiment, the stabilization operation 160 comprises applying a negative bias to the transistor control gate 104. In an exemplary embodiment, the negative bias voltage is between approximately −25 volts and approximately −10 volts. In another exemplary embodiment, the negative bias voltage is between approximately −20 volts and approximately −15 volts. Other like ranges can be used as well. Application of such bias voltages causes electrons in relatively shallow trap sites to be driven from the charge trapping layer 102 to the substrate 114 or the control gate 104, such that the electrons remaining in the charge trapping layer 102 are in relatively deep trap sites. The electrons in relatively deep trap sites have increased stability during high temperature, high electric field, or other operations on the memory cell, and therefore the decrease in $V_{th}$ over time is reduced in the stabilized memory device. The "lost" electrons are then optionally replaced by supplying additional electrons which are refilled into deep trap sites. The result of this operation is that an increased proportion of the electrons remaining in the charge trapping layer 102 are in relatively deep trap sites.

The application of a negative bias to the transistor control gate 104 can be alternated with CHE programming processes to further stabilize the memory device. For example, in one embodiment, a memory device is programmed using the CHE technique followed by application of a negative bias to the transistor control gate 104. This process is repeated three or more times, and during each repetition, a higher ratio of stable electrons are kept in trap sites in the charge trapping layer 102. The result is a memory device with a reduced $V_{th}$ decrease during the memory retention period of the device, and therefore an improved memory stability.

Figure 4:
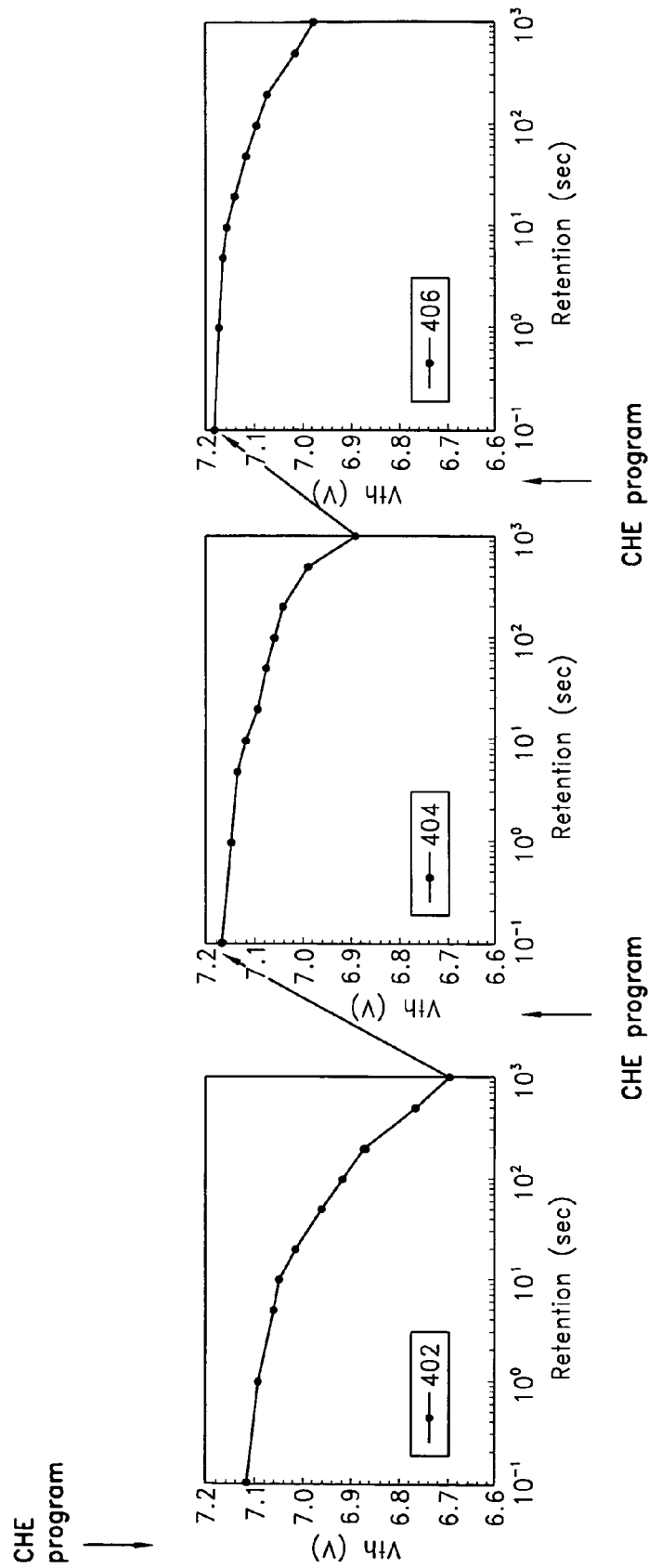
FIG. 4 is a schematic illustration of the reduced $V_{th}$ decrease obtained in an exemplary application of the CHE programming and negative gate biasing technique disclosed herein.

The process of alternating CHE programming and negative gate biasing a charge trapping flash memory device that uses an ONO stack to trap charges is illustrated in FIG. 4. In one exemplary application of the techniques disclosed herein, after a first CHE programming and negative gate biasing process, the device $V_{th}$ decreases by approximately 0.43 volts, as indicated by line 402. However, after a second CHE refilling and negative gate biasing process, the device $V_{th}$ decreases by approximately 0.28 volts, as indicated by line 404. Additionally, after a third CHE refilling and negative gate biasing process, the device $V_{th}$ decreases by approximately only 0.20 volts.

Referring again to FIG. 3, in an exemplary embodiment, the stabilization operation 160 additionally or instead comprises a baking process applied to a programmed memory cell. During high temperature baking, electrons are thermally emitted from relatively shallow trap sites, and are recaptured and stabilized in relatively deep trap sites. In particular, by configuring the baking time appropriately, a large proportion of the released electrons are recaptured into deep trap sites, rather than being ejected from the gate insulator. The electrons in relatively deep trap sites have increased stability during high temperature, high electric field, or other operations on the memory cell, and therefore the decrease in $V_{th}$ over time is reduced in the stabilized memory device.

In an exemplary embodiment, the baking temperature is between approximately 50° C. and approximately 400° C. In another exemplary embodiment, the baking temperature is between approximately 50° C. and approximately 350° C. In another exemplary embodiment, the baking temperature is between approximately 100° C. and approximately 300° C. In an exemplary embodiment, the baking temperature is approximately 250° C.

Generally, shorter baking times can be achieved by using higher baking temperatures. For example, at approximately 250° C., between approximately 5 minutes and approximately 20 minutes of baking provides substantial stabilization of a programmed device, while at approximately 150° C., more than approximately 30 minutes of baking provides substantial stabilization of a programmed device. Therefore, in one embodiment the baking time is between approximately 5 minutes and approximately 36 hours. In another embodiment, the baking time is between approximately 1 hours and approximately 24 hours.

Figure 5:
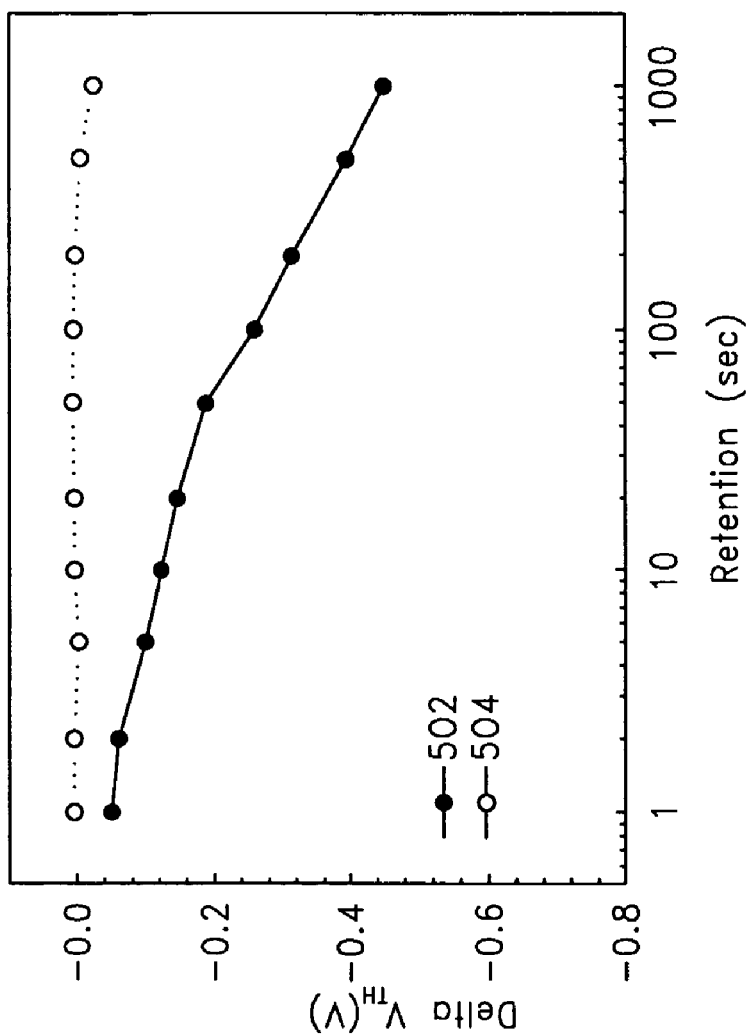
FIG. 5 is a chart illustrating the reduction in $V_{th}$ as a function of memory retention time for a memory device subjected to an exemplary high temperature baking process, and for an unprocessed memory device.
Figure 6:
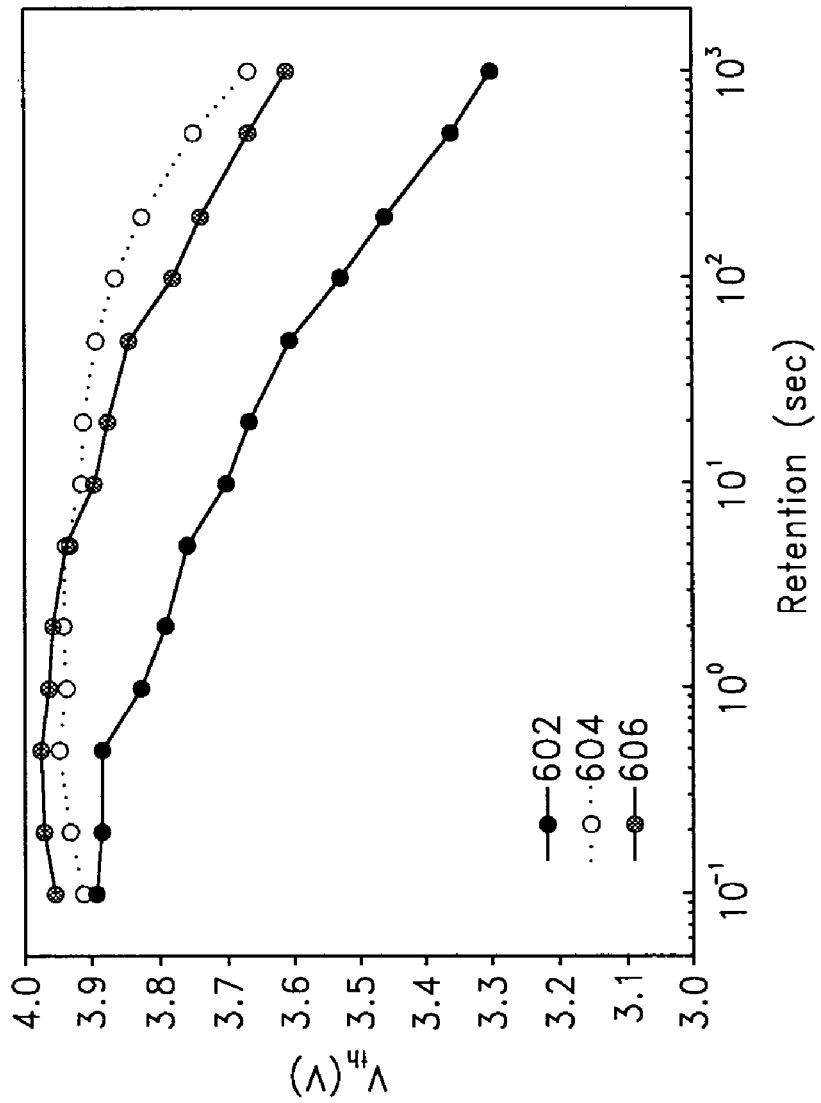
FIG. 6 is a chart illustrating the reduction in $V_{th}$ as a function of memory retention time for a memory device subjected to selected exemplary high temperature baking processes, and for an unprocessed memory device.

FIGS. 5 and 6 illustrate the advantageous results obtained in an exemplary embodiment using the baking technique disclosed herein to stabilize electrons in the charge trapping layer 102. For example, FIG. 5 illustrates the reduction in $V_{th}$ as a function of memory retention time for a memory device not subjected to a high temperature baking process (line 502), and for a memory device subjected to a one hour, 250° C. baking process (line 504). As illustrated, the memory device subjected to the high temperature baking process undergoes only a negligible reduction in $V_{th}$, whereas the unprocessed memory device undergoes a significant reduction in $V_{th}$. Using the parameters provided in this example, the baking process itself induced a reduction in $V_{th}$ of approximately 0.14 volts. Other parameters can be used in other embodiments.

Likewise, FIG. 6 illustrates the reduction in $V_{th}$ as a function of memory retention time for a nitrided read only memory ("NROM") device not subjected to a high temperature baking process (line 602), and for two NROM devices subjected to a high temperature baking process (lines 604, 606). In particular, the device represented by line 604 was subjected to a five minute, 250° C. baking process, while the device represented by line 606 was subjected to a twenty minute baking process at a temperature ranging from 180° C. to 250° C. As illustrated, the devices subjected to a baking process underwent a significantly smaller $V_{th}$ reduction than the unprocessed device. Specifically, in about 10 seconds the un-stabilized NROM device (line 602) experienced $\Delta V_{th}$ of approximately −0.2 volts, whereas the stabilized NROM devices (lines 604, 606) experienced this same $\Delta V_{th}$ after approximately 800 seconds.

The techniques described herein for increasing data retention can be applied to memory devices that use point defect trapping sites to capture charges. One class of memory devices that falls into this category is nitride memory devices, which generally includes metal-nitride-oxide-semiconductor ("MNOS") structures, semiconductor-oxide-nitride-oxide-semiconductor ("SONOS") structures, metal-oxide-nitride-oxide-semiconductor ("MONOS") structures, NROM, and structures programmed by hot hole injection nitride electron storage ("PHINES"). Other examples of memory devices that use traps to capture charges include aluminum oxide memory devices and hafnium oxide memory devices.

SCOPE OF THE INVENTION

While the foregoing detailed description discloses several embodiments of the present invention, it should be understood that this disclosure is illustrative only and is not limiting of the present invention. It should be appreciated that the specific configurations and operations disclosed can differ from those described above, and that the methods described herein can be used in contexts other than memory cells.

We claim:

1. A method of enhancing memory retention in a memory device, comprising:
    trapping a plurality of electric charges in a charge trapping layer of the memory device, the charge trapping layer positioned between a transistor control gate and a transistor channel region;
    applying a negative voltage bias to the transistor control gate to cause electric charges to move from a relatively shallow trap to a substrate;
    the negative voltage bias applying step alternating with a programming at least two times consecutively, so that decrease of threshold voltage of the transistor is substantially reduced; and
    performing a memory operation on the memory device.

2. The method of claim 1, wherein the relatively shallow trap site is a trap site at an energy level of less than or equal to approximately 1.5 eV.

3. The method of claim 1, wherein the electric charges are trapped using the channel hot electron technique.

4. The method of claim 1, wherein the memory device is a field effect transistor.

5. The method of claim 1, wherein the memory device is a nitrided read only memory device.

6. The method of claim 1, wherein the charge trapping layer is insulated from the transistor control gate and the transistor channel region by a gate insulator.

7. The method of claim 1, wherein the charge trapping layer is insulated from the transistor control gate and the transistor channel region by a gate insulator, and wherein the gate insulator comprises an oxide material.

8. The method of claim 1, wherein the charge trapping layer comprises a nitride material.

9. The method of claim 1, wherein the negative voltage bias is a voltage between approximately −10 volts and approximately −25 volts.

10. The method of claim 1, wherein the negative voltage bias is a voltage between approximately −15 volts and approximately −20 volts.

11. The method of claim 1, wherein the memory operation is a read operation.

12. The method of claim 1, wherein:
the memory device has a first data retention time before application of the negative voltage bias; and
the memory device has a second data retention time after application of the negative voltage bias, wherein
the second data retention time is at least ten times greater than the first data retention time.

13. A method of stabilizing a memory device, comprising:
trapping a plurality of electric charges in a charge trapping layer of the memory device, the charge trapping layer positioned between a transistor control gate and a transistor channel region;
subjecting the memory device to a high-temperature baking process to cause electric charges to move from a relatively shallow trap site to a relatively deep trap site;
the high-temperature baking process alternating with a programming at least two times consecutively, so that decrease of threshold voltage of the transistor is substantially reduced; and
performing a memory operation on the memory device.

14. The method of claim 13, wherein the relatively shallow trap site is a trap site at an energy level of less than or equal to approximately 1.5 eV.

15. The method of claim 13, wherein the electric charges are trapped using a channel hot electron technique.

16. The method of claim 13, wherein the memory device includes a field effect transistor.

17. The method of claim 13, wherein the memory device includes a nitride read only memory device.

18. The method of claim 13, wherein the charge trapping layer is insulated from the transistor control gate and the transistor channel region by a gate insulator.

19. The method of claim 13, wherein the charge trapping layer is insulated from the transistor control gate and the transistor channel region by a gate insulator, and wherein the gate insulator comprises an oxide material.

20. The method of claim 13, wherein the charge trapping layer comprises a nitride material.

21. The method of claim 13, wherein the high-temperature baking process has a duration of between approximately 20 minutes and approximately 30 minutes.

22. The method of claim 13, wherein the high-temperature baking process has a duration of between approximately 5 minutes and approximately 36 hours.

23. The method of claim 13, wherein the high-temperature baking process is conducted at a temperature between approximately 50° C. and approximately 400° C.

24. The method of claim 13, wherein the high-temperature baking process comprises baking the memory device at approximately 250° C. for approximately 20 minutes.

25. The method of claim 13, wherein the high-temperature baking process comprises baking the memory device at approximately 250° C. for approximately 5 minutes.

26. The method of claim 13, wherein the memory operation is a read operation.

27. The method of claim 13, wherein:
the memory device has a first data retention time before application of the negative voltage bias; and
the memory device has a second data retention time after application of the negative voltage bias, wherein
the second data retention time is at least ten times greater than the first data retention time.

28. A method comprising:
trapping a plurality of electric charges in a charge trapping layer of a transistor, wherein the charge trapping layer is separated from a transistor control gate and a transistor channel region by a gate insulator;
performing a charge stabilization operation on the electric charges trapped in the charge trapping layer to reduce the quantity of electric charges in shallow trap sites, and
the charge stabilization operation alternating with a programming at least two times consecutively, so that decrease of threshold voltage of the transistor is substantially reduced.

29. The method of claim 28, wherein the charge stabilization operation comprises applying a negative voltage bias having a voltage between approximately −10 volts and approximately −25 volts to the transistor control gate.

30. The method of claim 28, wherein the charge stabilization operation comprises subjecting the transistor to a high-temperature baking process having a temperature between approximately 50° C. and approximately 400° C.

31. The method of claim 28, further comprising performing a read operation on the transistor after performing the charge stabilization operation.

32. The method of claim 28, wherein the gate insulator and the charge trapping layer form an oxide-nitride-oxide stack.

33. The method of claim 28, wherein:
the transistor has a first data retention time before performing the charge stabilization operation;
the transistor has a second data retention time after performing the charge stabilization operation; and
the second data retention time is at least ten times greater than the first data retention time.

* * * * *